(12) United States Patent
Reijnders (10) Patent No.: US 10,241,425 B2
(45) Date of Patent: Mar. 26, 2019

(54) LEVEL SENSOR, LITHOGRAPHIC APPARATUS AND DEVICE MANUFACTURING METHOD

(71) Applicant: ASML NETHERLANDS B.V., Veldhoven (NL)

(72) Inventor: Marinus Petrus Reijnders, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 87 days.

(21) Appl. No.: 15/536,062

(22) PCT Filed: Nov. 19, 2015

(86) PCT No.: PCT/EP2015/077104
§ 371 (c)(1),
(2) Date: Jun. 14, 2017

(87) PCT Pub. No.: WO2016/102127
PCT Pub. Date: Jun. 30, 2016

(65) Prior Publication Data
US 2018/0341188 A1 Nov. 29, 2018

(30) Foreign Application Priority Data
Dec. 22, 2014 (EP) .................................. 14199544

(51) Int. Cl.
*G03F 7/20* (2006.01)
*G03F 9/00* (2006.01)

(52) U.S. Cl.
CPC ........ *G03F 9/7034* (2013.01); *G03F 7/70641* (2013.01); *G03F 9/7026* (2013.01);
(Continued)

(58) Field of Classification Search
CPC .. G03F 7/70641; G03F 9/7026; G03F 9/7034; G03F 9/7046; G03F 9/7049; G03F 9/7088
(Continued)

(56) References Cited

U.S. PATENT DOCUMENTS

| 4,772,119 A * | 9/1988 | Bouwhuis ............... G03F 7/706 356/124 |
| 4,988,886 A | 1/1991 | Palum et al. |

(Continued)

FOREIGN PATENT DOCUMENTS

| JP | S54-104859 | 8/1979 |
| JP | S59-160109 | 9/1984 |

(Continued)

OTHER PUBLICATIONS

International Search Report and Written Opinion dated May 24, 2016 in corresponding International Patent Application No. PCT/EP2015/077104.

*Primary Examiner* — Colin Kreutzer
(74) *Attorney, Agent, or Firm* — Pillsbury Winthrop Shaw Pittman LLP (57) ABSTRACT

A level sensor to determine a height level of a substrate, that includes a projection unit including a projection grating having a period P, the projection grating configured to provide a patterned measurement beam, to the substrate, having a periodically varying intensity distribution in a first direction having the period P; a detection unit to receive a reflected patterned measurement beam after reflection on the substrate, the reflected patterned measurement beam having a periodically varying intensity distribution in a second direction, having the period P, wherein the detection unit has a sensor array to receive the reflected patterned measurement beam, the sensor array including a plurality of sensing elements arranged along the second direction at a pitch p (Continued)

smaller than or equal to half the period P, and a processing unit to determine the height level of the substrate based on a signal from the sensor.

20 Claims, 7 Drawing Sheets (52) U.S. Cl.
CPC .......... *G03F 9/7046* (2013.01); *G03F 9/7049* (2013.01); *G03F 9/7088* (2013.01)

(58) Field of Classification Search
USPC ........................................ 355/53, 55, 67, 68
See application file for complete search history.

(56) References Cited

U.S. PATENT DOCUMENTS

| | | | |
|---|---|---|---|
| 5,075,562 | A | 12/1991 | Greivenkamp, Jr. et al. |
| 6,763,133 | B1 | 7/2004 | Park et al. |
| 9,488,465 | B2 | 11/2016 | Khuat Duy et al. |
| 2012/0008150 | A1* | 1/2012 | Smith ................ G01B 11/0608 356/616 |
| 2012/0015461 | A1* | 1/2012 | Donaher ................ G03F 7/706 438/16 |
| 2013/0128247 | A1 | 5/2013 | Khuat Duy et al. |

FOREIGN PATENT DOCUMENTS

| | | |
|---|---|---|
| JP | 2013-110398 | 6/2013 |
| JP | 2013-236074 | 11/2013 |
| WO | WO 2012/009197 | 1/2012 |

\* cited by examiner

Fig. 1

PRIOR ART

LEVEL SENSOR, LITHOGRAPHIC APPARATUS AND DEVICE MANUFACTURING METHOD

CROSS-REFERENCE TO RELATED APPLICATION

This application is the U.S. national phase entry of PCT patent application No. PCT/EP2015/077104, which was filed on Nov. 19, 2015, which claims the benefit of priority of European patent application No. 14199544.9, which was filed on Dec. 22, 2014, and which is incorporated herein in its entirety by reference.

BACKGROUND

Field of the Invention

The present invention relates to a level sensor, a lithographic apparatus including a level sensor and a device manufacturing method.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction.

In general, the surface of a substrate on which a pattern should be projected is not completely flat. Moreover, a substrate can show thickness variation of several microns. This unflatness and/or thickness variation of the substrate surface may result in incorrect projection of the pattern, for instance due to focus errors or imaging errors. To correct for unflatness and/or thickness variation of a substrate, it has been proposed to provide a level sensor, desirably integrated in the lithographic apparatus. Such a level sensor may be used to determine a height map of a substrate, before a pattern is transferred, e.g., projected, on the substrate. This height map may subsequently be used to correct the position of the substrate during transfer of the pattern on the substrate, in order to maintain an aerial image of the patterning device into focus.

Typically, such a level sensor comprises a projection unit to project a measurement beam on the substrate, the projection unit comprising a projection grating arranged to impart the measurement beam with a substantially periodic radiation intensity; a detection unit, typically comprising two or more detectors, to receive the measurement beam after reflection on the substrate, and a processing unit to calculate a height level on the basis of the measurement beam parts received by the detectors of the detection unit.

In known arrangements, the detection unit of a level sensor may be rather bulky and complex, e.g. including a detection grating configured to split the reflected measurement beam into different parts which are received by separate sensors.

SUMMARY

It would be desirable to provide a level sensor for use in a lithographic apparatus that is less complex.

Therefore, in an aspect of the present invention, there is provided a level sensor configured to determine a height level of a substrate, the level sensor comprising:
  a projection unit configured to project a measurement beam on the substrate, the projection unit comprising a projection grating having a period P, the projection grating being configured to impart the measurement beam, thereby obtaining a patterned measurement beam having a periodically varying intensity distribution in a first direction having the period P;
  a detection unit to receive a reflected patterned measurement beam after reflection on the substrate; the reflected patterned measurement beam having a periodically varying intensity distribution in a second direction, having the period P;
  wherein the detection unit comprises a sensor array configured to receive the reflected patterned measurement beam having the periodically varying intensity distribution,
  whereby the sensor array comprises a plurality of sensing elements, the plurality of sensing elements being arranged along the second direction at a pitch p that is smaller than or equal to half the period P, and;
  a processing unit configured to receive, at an input, one or more sensor signals from the sensor array and to determine the height level of the substrate based on the one or more sensor signals received from the sensor array.

According to another aspect of the present invention, there is provided a device manufacturing method comprising:
  providing a substrate on a substrate table;
  measuring a height level of the substrate on the substrate table using a level sensor according to the present invention;
  projecting a patterned beam of radiation onto the substrate, thereby positioning the substrate relative to the patterned beam, wherein said positioning is at least partly based on said measured height level.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
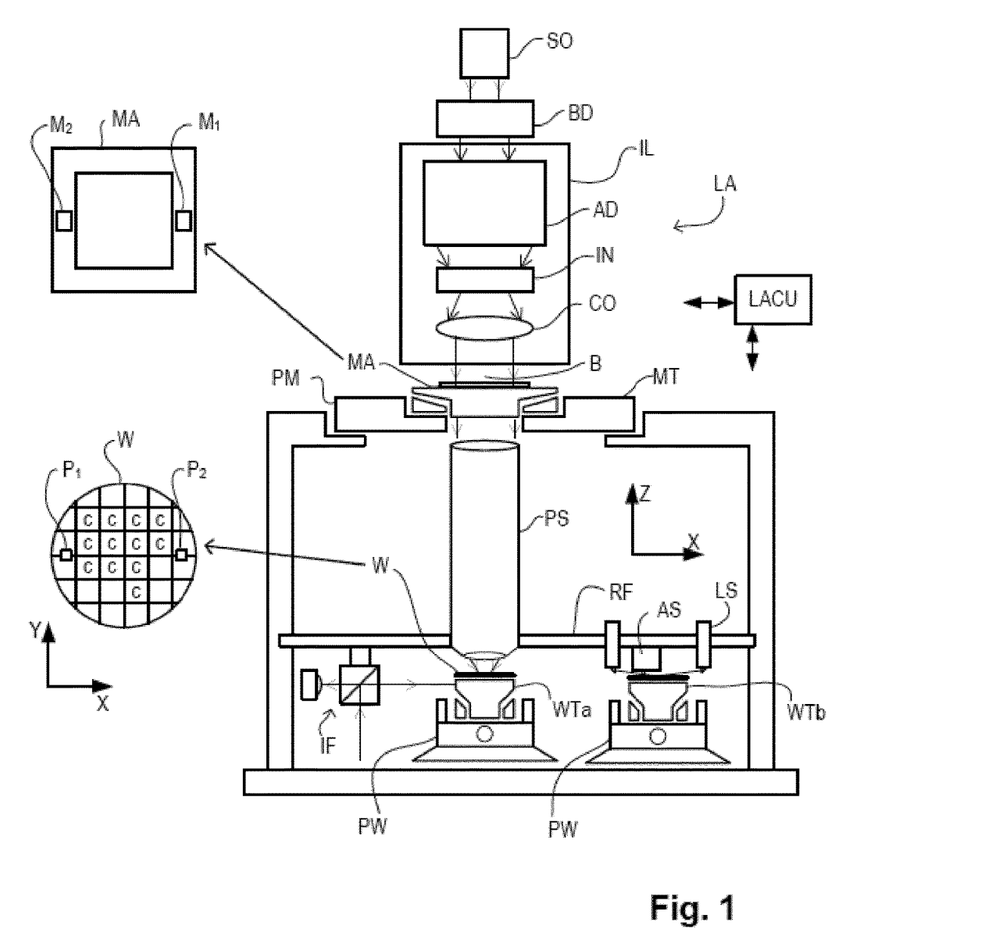
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam in different directions. The tilted minors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.
2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS.

The level sensor LS may e.g. be a level sensor according to the present invention, which is explained in more detail below.

A so-called dual stage type apparatus enables a substantial increase in the throughput of the apparatus because the exposure of a substrate can be performed simultaneously with the preparatory steps of a subsequent substrate. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
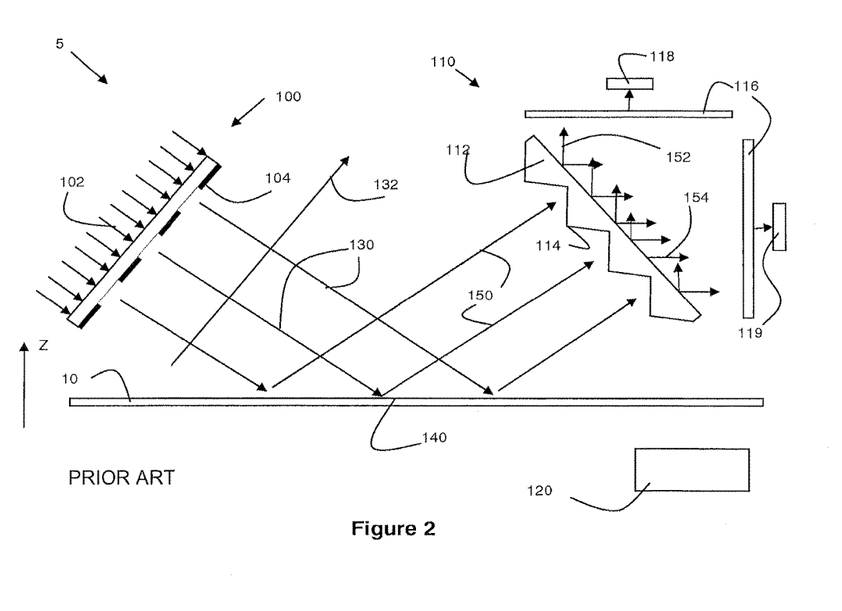
FIG. 2 depicts a level sensor as known in the art.

In FIG. 2, a level sensor as known in the art is schematically shown. The level sensor 5 is configured to determine a height map of a substrate 10. This height map may be used to correct the position of a substrate during projection of a pattern on the substrate 10. The level sensor comprises a projection unit 100, a detection unit 110, and a processing unit 120. The projection unit 100 comprises a light source providing a light beam 102 which is imparted by a projection grating 104 of the projection unit 100. The light source may e.g. be a broadband light source, polarized or unpolarized, pulsed or continuous. The light source may e.g. be a polarized or non-polarized laser beam source. The light source may include a plurality of light sources having different colors. Note that, in accordance with the present invention, light should not be restricted to visible light, but is understood to encompass any type of radiation suitable to reflect on the surface of a substrate.

The projection grating 104 as shown is a periodic grating, i.e. a pattern having a periodic structure resulting in a measurement beam 130 having a spatially-periodically varying intensity, i.e. the intensity of the patterned measurement beam varies periodically along the direction indicated by the arrow 132. The measurement beam with the spatially periodically varying intensity 130 is directed towards a measurement location 140 on the substrate 10. At the measurement location 140, the measurement beam is reflected on the substrate 10 and reflected (indicated by arrows 150) towards the detection unit 110. Note that further optical elements may be provided along the path of the patterned measurement beam between the projection unit 100 and the detection unit 110. The detection unit 110 comprises a detection grating 112 comprising triangular features 114 to split the reflected measurement beam 150 and direct the received reflected measurement beam to two distinct directions 152, 154. The redirected beams (along directions 152 and 154) are subsequently received by focusing optics 116 of the detection unit 110, the focusing optics 116 being configured to image the received redirected beams onto separated detectors 118 and 119, e.g., photo detectors 118, 119, of the detection unit 110. The signals generated by the detectors 118, 119 are subsequently provided to the processing unit 120 of the level sensor 5. The processing unit 120 is further configured to determine a height of the substrate 10, i.e. a position of the substrate in the indicated Z-direction, based on the signals received.

The level sensor 5 as schematically shown in FIG. 2 thus requires a detection grating 112 and focusing optics 116 in order to separate and redirect the reflected measurement beam 150 towards the detectors 118 and 119. This may substantially add to the size, complexity and costs of the level sensor.

Further, the arrangement shown requires the use of two separate distinct detectors 118,119. In general, an important spectral variation or sensitivity may be noticed when combining different sensors. Such a variation in spectral sensitivity may be attributed to the fact that such distinct separate sensors may be manufactured from using materials that are not exactly the same, or by means of processes that are slightly different. The use of sensors have a different sensitivity, in particular a difference in sensitivity with respect to different wavelengths, may have an adverse effect on the accuracy at which the level sensor can operate. In case of such different sensitivity, it will be difficult to determine a correct height level based on the sensor output signals. Even when such different sensitivity would be known (e.g. by means of a calibration), this may be insufficient to improve accuracy. The reason for this being that, even though the spectrum of the projected measurement beam may be known, the spectrum of the reflected measurement beam may not, as it depends on the type of resist applied. As such, in order to obtain an accurate height measurement using sensors having a different spectral sensitivity, the spectral sensitivity for each sensor should be known as well as the spectral distribution of a reflected measurement beam, the latter depending on the resist that is used. As such, the use of different sensors, i.e. sensors having a different sensitivity, results in large increase in complexity to arrive at an accurate position measurement. In order to mitigate this problem, sets of sensors may be selected based on measured spectral sensitivities. However, the yield of obtaining pairs or sets of sensors having a sufficiently matching spectral specification may be low, increasing the costs of the detection unit 110.

Further, due to the applied detection grating 112 and focusing optics 116, the intensity of the reflected measurement beam 150 is reduced. In order to anticipate on this, power requirements may need to be increased at the projection unit 100. Applying a more powerful measurement beam may however result in an increased risk of affecting a resist layer present on the substrate 10.

In order to address one or more of these concerns, the present invention proposes an alternative way to detect a reflected patterned measurement beam.

Figure 3:
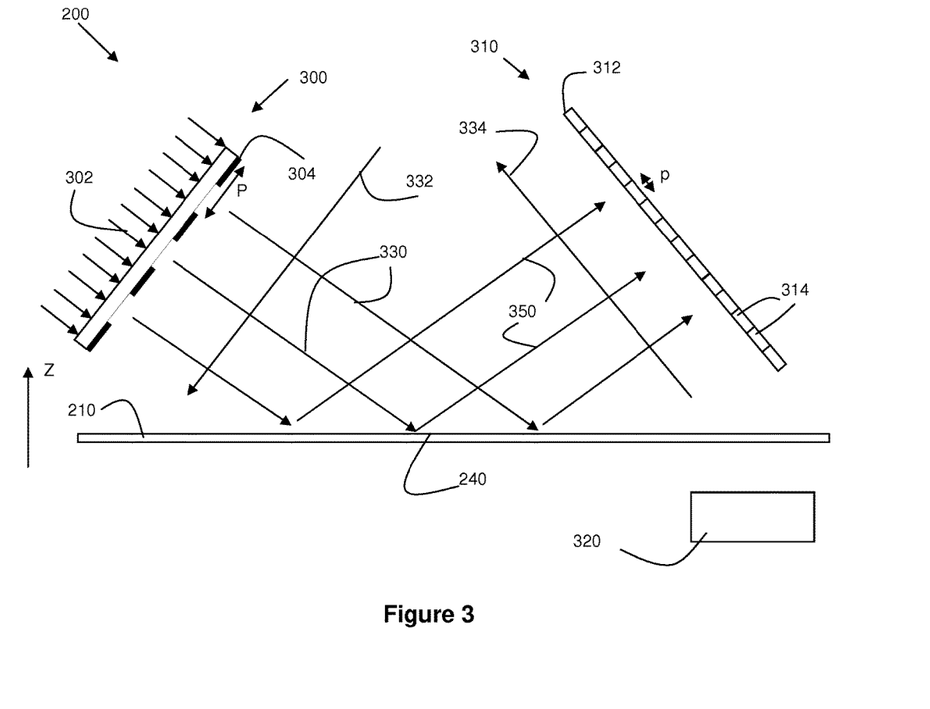
FIG. 3 depicts a level sensor according to an embodiment of the present invention.

FIG. 3 schematically shows a first embodiment of a level sensor 200 according to the present invention.

The level sensor 200 comprises a projection unit 300, a detection unit 310 and a processing unit 320.

Similar to the arrangement of FIG. 2, the projection unit 300 comprises a light source providing a light beam 302, e.g. a substantially uniform light beam which is imparted by a projection grating 304 of the projection unit 300. The light source may e.g. be a broadband light source or a source providing a polarized or non-polarized laser beam. The projection grating 304 as shown is a periodic grating, i.e. a pattern having a spatial period P. By imparting the light beam 302 by the projection grating 304, a measurement beam 330 having a spatially-periodically varying intensity, having a period P, is obtained. The intensity of the imparted measurement beam varies periodically along a first direction indicated by the arrow 332. The measurement beam with the spatially periodically varying intensity 330 is directed towards a measurement location 240 on the substrate 210. At the measurement location 240, the patterned measurement beam is reflected on the substrate 210 and reflected (350) towards the detection unit 310. Note that further optical elements, e.g., one or more lenses, may be provided along the path of the measurement beam between the projection unit 300 and the detection unit 310. The reflected patterned measurement beam 350 having a periodically varying intensity distribution in a second direction, indicated by the arrow 334, having the same period P.

In contrast to the detection unit 110 of the level sensor 5 of FIG. 2, the detection unit 310 as applied in the level sensor according to the present invention does not apply a detection grating for separating the patterned measurement beam. Rather, the detection unit 310 comprises a sensor array 312 configured to receive the reflected patterned measurement beam having the periodically varying intensity distribution, whereby the sensor array comprises a plurality of sensing elements 314, the plurality of sensing elements being arranged along the second direction (indicated by the arrow 334) at a pitch p that is (optimally) smaller than or equal to half the period P, within the meaning of the present invention, the pitch p is used to denote the distance between two adjacent sensing elements of the sensor array.

In accordance with the present invention, the periodically varying intensity distribution is thus directly projected on the sensor array 312. As such, a one-to-one correspondence can be noticed between a position along the periodically varying intensity distribution in the second direction and a position along the sensor array in the second direction. Compared to the known level sensor arrangement, the reflected patterned measurement beam need not be split up into different components but is projected, as a whole, on the sensor array.

In accordance with the present invention, the level sensor 200 further comprises a processing unit 320 to receive, at an input, one or more sensor signals from the sensor array and to determine the height level of the substrate based on the one or more sensor signals received from the sensor array 312.

In an embodiment, each sensing element may be configured to generate a separate output signal, representative of the amount of light received. These output signals may be provided to the processing unit 320. The processing unit 320 may then, based on the signals received and based on a known position of the sensing elements, determine a height of the substrate, e.g. by determining the average shift or displacement of the intensity pattern of the patterned measurement beam. As an alternative or in addition, a position of a maximum or minimum intensity may be determined and used to determine a height of the substrate.

As an alternative to each sensing element providing an output signal, two or more sensing elements may be connected to each other to obtain an output signal representing the combined amount of light received.

The following Figures schematically show some examples.

Figure 4:
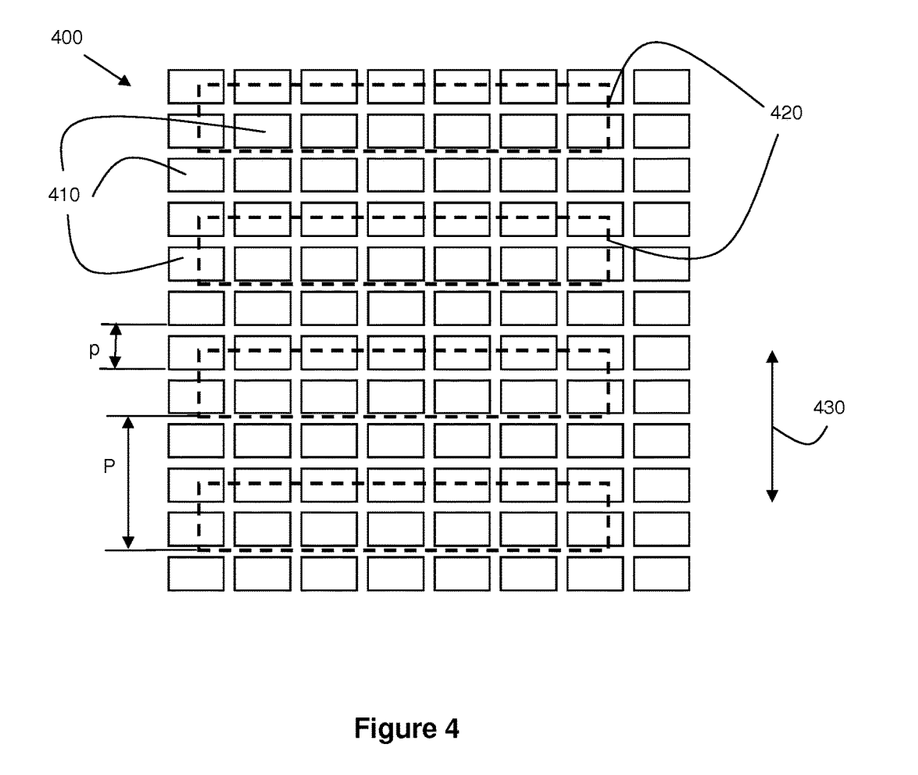
FIG. 4 depicts a first embodiment of a sensor array as can be applied in a level sensor according to the present invention.

In FIG. 4, a first embodiment is schematically shown of a sensor array as can be used in a detection unit of a level sensor according to the present invention. The sensor array 400 as shown includes a two-dimensional array of sensing elements 410. The two-dimensional array of sensing elements may e.g. be a 2D CCD image sensor or the like. In such arrangement, the sensing elements may be referred to as pixels of the CCD image sensor. Alternatively, the sensing elements 410 may be photodiodes or the like. FIG. 4 further indicates the pitch p at which the sensing elements 410 are positioned.

Figure 5:
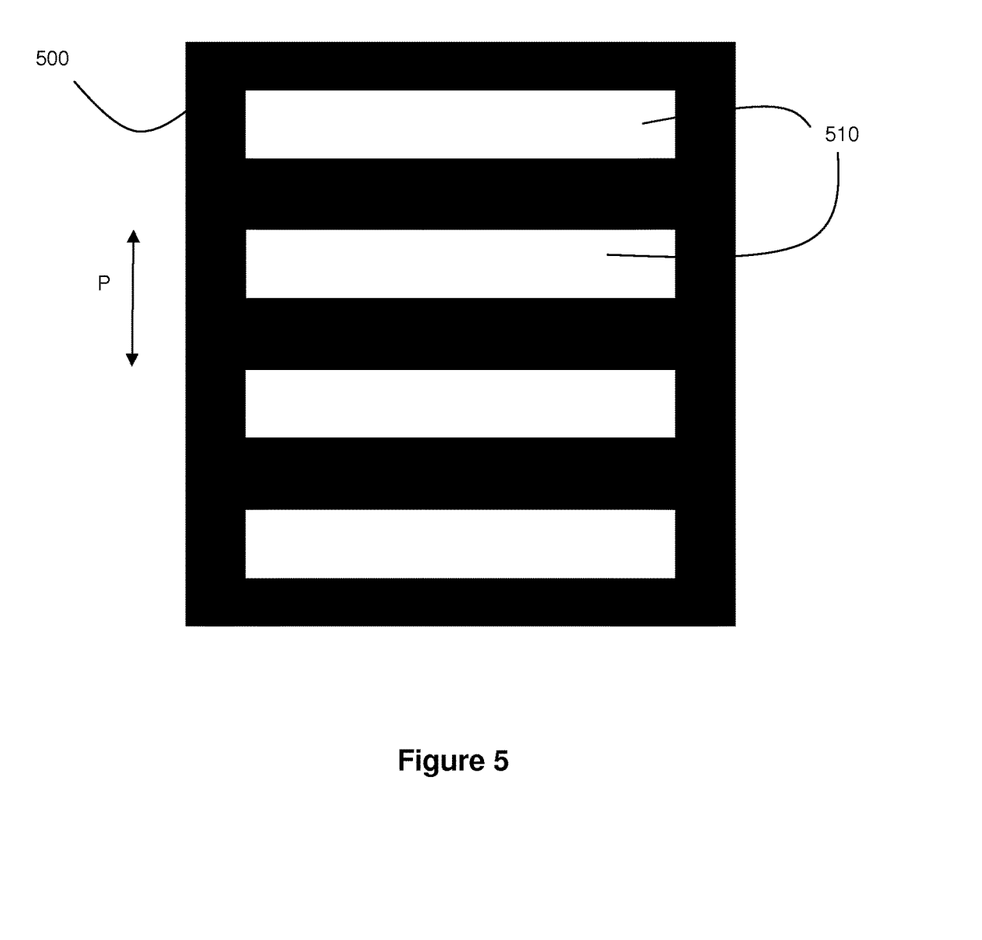
FIG. 5 depicts a projection grating as can be applied in a projection unit of a level sensor according to the present invention.

The dotted lines 420 in FIG. 4 schematically indicate the periodically varying intensity distribution of the reflected patterned measurement beam, P indicates the period of the periodically varying intensity distribution. Such an intensity distribution may e.g. be obtained using a projection grating 500 as schematically shown in FIG. 5. The projection grating 500 comprises a plurality of slot-shaped apertures 510 through which a measurement beam can be provided to obtain a patterned measurement beam having a periodically varying intensity distribution, having a period P.

Referring back to FIG. 4, the patterned measurement beam (as e.g. obtained using the projection grating 500 of FIG. 5) which is directly projected onto the sensing elements 410 may result in a current being generated in the sensing elements (in case the sensing elements are photodiodes) or may result in a charge being generated (in case of a CCD array or CCD cell). The currents or charges generated may e.g. be converted to a digital signal (using an ADC (analogue to digital conversion) and provided to a processing unit such as processing unit 320 of FIG. 3. As will be understood by the skilled person, when the height level of the substrate (i.e. the position of the substrate 240 along the Z-direction as shown in FIG. 3) changes, the position of the periodically varying intensity distribution (indicated by the dotted lines 420) will change proportionally, i.e. the periodically varying intensity distribution will displace in a direction indicated by the arrow 430. In order to determine the height of the substrate, it is therefore sufficient to assess the intensity distribution along the indicated direction 430. As such, sensing elements which are adjacent to each other in a direction perpendicular to the indicated direction 430 may be grouped or connected to form a single sensing element.

Figure 6:
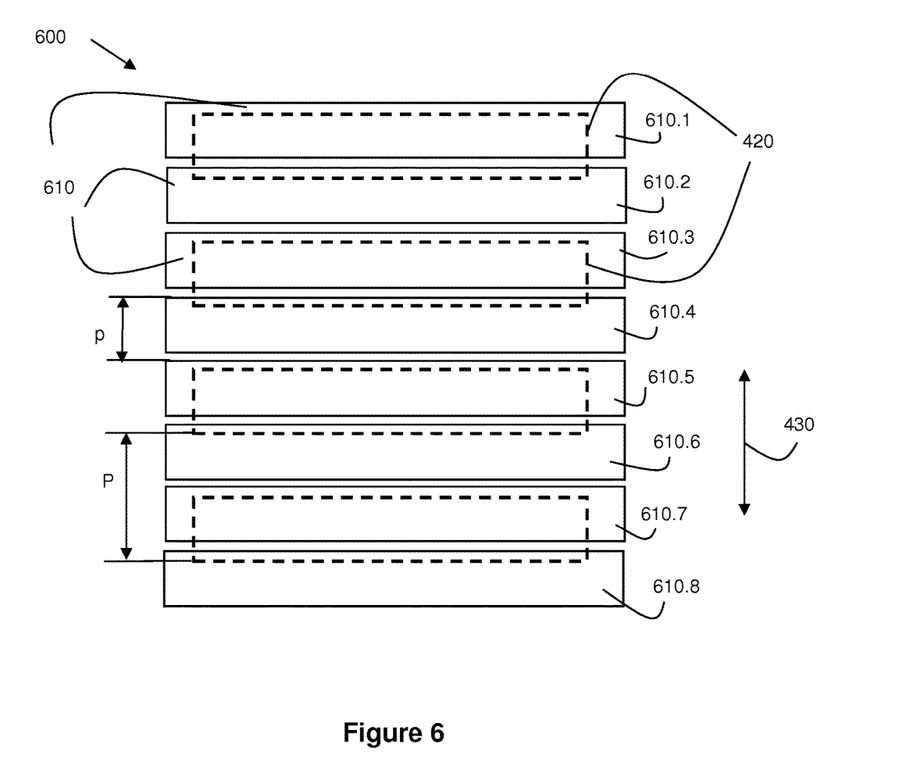
FIG. 6 depicts a second embodiment of a sensor array as can be applied in a level sensor according to the present invention.

In FIG. 6, such an arrangement of sensing elements forming a sensor array is schematically shown.

FIG. 6 schematically shows a sensor array 600 as can be applied in a level sensor according to the present invention, the sensor array 600 comprising a set of elongated sensing elements 610, elongated in a direction perpendicular to the direction 430 in which the periodically varying intensity distribution (indicated by the dotted lines 420) varies. Compared to the sensing elements 410 of FIG. 4, the sensing elements 610 of FIG. 6 are positioned adjacent to each other in the direction 430 at a pitch p substantially corresponding to half the period P. In such arrangements, the currents or charges generated in the sensing elements may by representative of the received intensity and be provided (e.g. via an ADC) to a processing unit. By selecting the pitch p substantially equal to half the period P, it can be observed that a further grouping of the sensing elements 610 is possible. As can be seen from FIG. 6, elements 610.1, 610.3, 610.5 and 610.7 are all subjected to the same intensity of the periodically varying intensity distribution. Similarly, elements 610.2, 610.4, 610.6 and 610.8 also experience the same intensity.

In an embodiment, the sensing elements that experience substantially the same intensity may be grouped into a first set and a second set. As such, in an embodiment of the present invention, the sensor array of the level sensor comprises a first set of sensing elements and a second set of sensing elements that are alternatingly arranged in the direction along which the intensity distribution varies periodically (i.e. direction 430 as indicated in FIGS. 4 and 6), a pitch of the first set of sensing elements and of the second set of sensing elements corresponding to the period P of the periodically varying intensity distribution of the reflected patterned measurement beam. Referring to FIG. 6, sensing elements 610.1, 610.3, 610.5 and 610.7 may thus be considered the first set of sensing elements, whereas sensing elements 610.2, 610.4, 610.6 and 610.8 are considered the second set of sensing element of the sensor array. The sensing elements in a set thus arranged at a pitch p, whereby 2*p=P. In general, sensing elements arranged at a pitch p, whereby n*p=P, n being an even integer, may be advantageously applied.

In an embodiment, the sensing elements of the first set of sensing elements are connected at a first common output of the sensor array, and the sensing elements of the second set of sensing elements are connected at a second common output of the sensor array.

Figure 7:
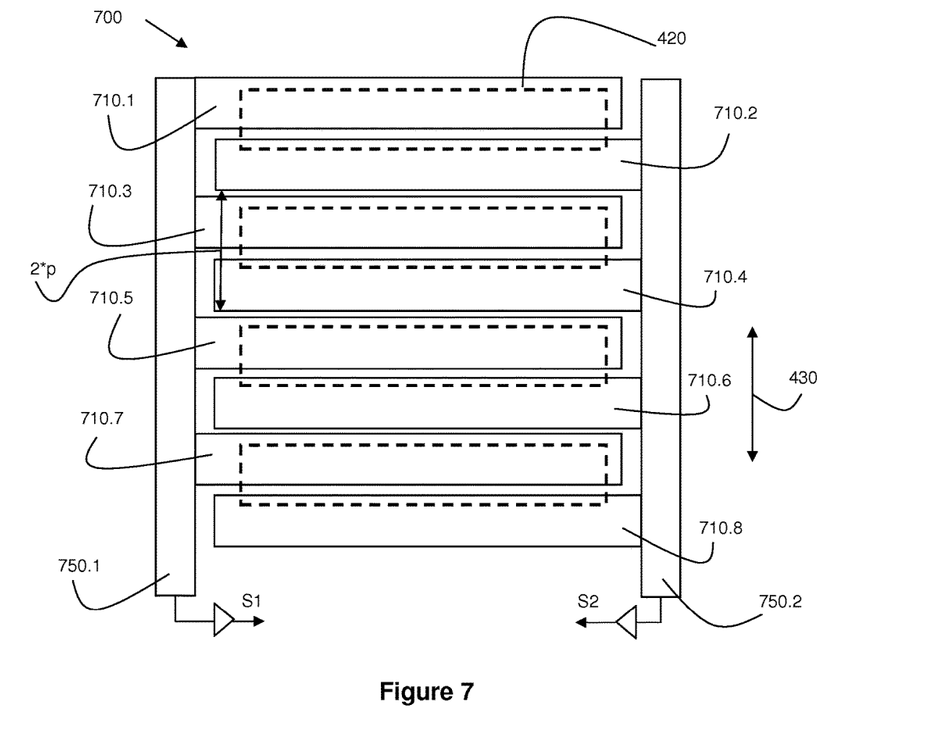
FIG. 7 depicts a third embodiment of a sensor array as can be applied in a level sensor according to the present invention.

Such an embodiment is schematically shown in FIG. 7. As can been seen, sensing elements 710.1, 710.3, 710.5 and 710.7 can be considered the first set of sensing elements, connected at a first common output 750.1, whereas sensing elements 710.2, 710.4, 710.6 and 710.8 are considered the second set of sensing elements of the sensor array, connected at a second common output 750.2.

FIG. 7 further shows the pitch 2*p at which two sensing elements of the same set are positioned.

In a preferred embodiment, the structure of the sensor array as schematically shown in FIG. 7 is manufactured using a single photodiode. By means of structuring (e.g. using focused ion beam milling or lithographic processes), the discrete sensing elements of the sets and the common outputs as shown can be realized. In such embodiment, the sensing elements are thus manufactured using substantially the same material, using substantially the same processes. As such, the sensing elements will have substantially the same spectral sensitivity.

In such arrangement, a pair of signals S1 and S2 may be obtained from the respective common outputs 750.1 and 750.2, which signals may be provided to a processing unit such as processing unit 320 of FIG. 3. Typical dimensions for the sensor array 700 as schematically shown are a width W of approx. 1 mm and a period P in a range of 5-300 µm, typically about 30 µm. The number of sensing elements per set may e.g. be in a range from 1 to 1000, preferably in a range from 5 to 100.

The level sensor according to the present invention may provide various advantages over the level sensor 5 as shown in FIG. 2.

The level sensor according to the present invention does not require the use of a detection grating or focusing optics as e.g. shown in FIG. 2, due to the direct application of the patterned reflected measurement beam onto the sensor array of the detection unit. As a result, the level sensor according to the present invention is less complex and has less components compared to the level sensor shown in FIG. 2. As such, the level sensor according to the present invention can be made more compact as well.

Further, the sensor array as applied in the detection unit of the level sensor can be manufacture as a whole from a common structure. The sensor array can e.g. be CCD array manufactured using lithographic processes on a substrate or can be made from a photodiode (as described above).

As a result, it can be expected that the sensing elements of the sensor array have closely matching properties, e.g. with respect to spectral sensitivity.

In a known level sensor, two or more distinct sensors (such as sensors 118, 119 of FIG. 2) are used. Without proper selection, such pair of sensors would have a poor matching with respect to spectral sensitivity.

Further, due to the absence of the detection grating and focusing optics, the power requirements for the light source as applied may be reduced. It is expected that a reduction of approx. 50% can be realized. The reduced power requirement may enable the use of light sources having a comparatively low power such as UV LED based light sources.

With reference to above embodiments, notably those of FIG. 4 and of FIG. 6, accuracy of the level sensor could be improved by taking into account the following. A measurement spot on the substrate comprises the image of multiple grating lines. The height of the substrate at the location of the measurement spot can be determined by combining the signals produced by the individual grating lines to determine an average grating shift. In the situation that the reflection at the substrate is constant over the measurement spot, this combining leads to a height (at the location of the measurement spot at the wafer) that is correct. However, if the substrate's reflection is not constant over the measurement spot, due to for example patterns at the substrate's surface), the intensity of the image produced by the different grating lines in the measurement spot is not uniform (see FIG. 5). If this is not taken into account, some parts of the measurement spot contribute more to the signal representative of the height, than other parts owing to their different light intensities. This can be solved if the individual grating line height shifts are measured individually (e.g. with the embodiment from FIG. 4 or FIG. 6) and averaged afterwards In an embodiment, there is provided a level sensor configured to determine a height level of a substrate, the level sensor comprising: a projection unit configured to project a measurement beam on the substrate, the projection unit comprising a projection grating having a period P, the projection grating being configured to impart the measurement beam, thereby obtaining a patterned measurement beam having a periodically varying intensity distribution in a first direction having the period P; a detection unit to receive a reflected patterned measurement beam after reflection on the substrate; the reflected patterned measurement beam having a periodically varying intensity distribution in a second direction, having the period P, wherein the detection unit comprises a sensor array configured to receive the reflected patterned measurement beam having the periodically varying intensity distribution, whereby the sensor array comprises a plurality of sensing elements, the plurality of sensing elements being arranged along the second direction at a pitch p that is smaller than or substantially equal to half the period P; and a processing unit configured to receive, at an input, one or more sensor signals from the sensor array and to determine the height level of the substrate based on the one or more sensor signals received from the sensor array.

In an embodiment, the sensor array is configured to directly receive the periodically intensity distribution of the reflected patterned measurement beam. In an embodiment, the level sensor has a one-to-one correspondence between a position along the periodic intensity distribution in the second direction and a position along the sensor array in the second direction. In an embodiment, the sensor array comprises a first set of sensing elements and a second set of sensing elements that are alternatingly arranged along the second direction at a pitch p, whereby n*p, n being an even number, corresponds to the period P of the periodically varying intensity distribution of the reflected patterned measurement beam. In an embodiment, the sensing elements of the first set of sensing elements are connected at a first common output of the sensor array, and wherein the sensing elements of the second set of sensing elements are connected at a second common output of the sensor array. In an embodiment, the processing unit has a first input to receive a first signal from the first common output of the sensor array and a second input to receive a second signal from the second common output of the sensor array for determining the height of the substrate. In an embodiment, the sensor array is manufactured from a single photodiode or a CCD cell. In an embodiment, the sensor array comprises a two-dimensional array of sensing elements, such as a 2D CCD array.

In an embodiment, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a level sensor as described herein to measure a height level of a substrate on the substrate table.

In an embodiment, there is provided a device manufacturing method comprising: providing a substrate on a substrate table; measuring a height level of the substrate on the substrate table using a level sensor as described herein; projecting a patterned beam of radiation onto the substrate, thereby positioning the substrate relative to the patterned beam, wherein the positioning is at least partly based on said measured height level.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A level sensor system configured to determine a height level of a substrate, the level sensor system comprising:
    a projection unit configured to project a measurement beam on the substrate, the projection unit comprising a projection grating having a period P, the projection grating configured to provide a patterned measurement beam having a periodically varying intensity distribution in a first direction having the period P;
    a detection unit to receive a reflected patterned measurement beam after reflection on the substrate, the reflected patterned measurement beam having a periodically varying intensity distribution in a second direction, having the period P, wherein the detection unit comprises a sensor array configured to receive the reflected patterned measurement beam having the periodically varying intensity distribution, wherein the sensor array comprises a plurality of sensing elements, the plurality of sensing elements being arranged along the second direction at a pitch that is smaller than or substantially equal to half the period P, and wherein the sensor array comprises a first set of sensing elements and a second set of sensing elements that are alternatingly arranged along the second direction at a pitch p, wherein n*p, n being an even number, corresponds to the period P of the reflected patterned measurement beam and the sensing elements of the first set of sensing elements are connected at a first common output of the sensor array and the sensing elements of the second set of sensing elements are connected at a second common output of the sensor array; and
    a processing unit configured to receive, at an input, one or more sensor signals from the sensor array and to determine the height level of the substrate based on the one or more sensor signals received from the sensor array.

2. The level sensor system according to claim 1, wherein the sensor array is configured to directly receive the periodically varying intensity distribution of the reflected patterned measurement beam.

3. The level sensor system according to claim 1, having a one-to-one correspondence between a position along the periodically varying intensity distribution in the second direction and a position along the sensor array in the second direction.

4. The level sensor system according to claim 1, wherein the processing unit has a first input to receive a first signal from the first common output of the sensor array and a second input to receive a second signal from the second common output of the sensor array for determining the height of the substrate.

5. The level sensor system according to claim 1, wherein the sensor array is manufactured from a single photodiode or a CCD cell.

6. The level sensor system according to claim 1, wherein the sensor array comprises a two-dimensional array of sensing elements.

7. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate; and
    the level sensor system according to claim 1 to measure a height level of a substrate on the substrate table.

8. The lithographic apparatus according to claim 7, wherein the sensor array is configured to directly receive the periodically varying intensity distribution of the reflected patterned measurement beam.

9. The lithographic apparatus according to claim 7, having a one-to-one correspondence between a position along the periodically varying intensity distribution in the second direction and a position along the sensor array in the second direction.

10. The lithographic apparatus according to claim 7, wherein the processing unit has a first input to receive a first signal from the first common output of the sensor array and a second input to receive a second signal from the second common output of the sensor array for determining the height of the substrate.

11. The lithographic apparatus according to claim 7, wherein the projection grating comprises a plurality of slot-shaped apertures.

12. The lithographic apparatus according to claim 11, wherein the sensing elements are elongated in a direction perpendicular to the first direction of the periodically varying intensity distribution.

13. The level sensor system according to claim 1, wherein the projection grating comprises a plurality of slot-shaped apertures.

14. The level sensor system according to claim 13, wherein the sensing elements are elongated in a direction perpendicular to the first direction of the periodically varying intensity distribution.

15. A method of determining a height level of a substrate, the method comprising:
projecting a patterned measurement beam having a periodically varying intensity distribution in a first direction having the period P onto a substrate;
receiving a reflected patterned measurement beam, after reflection on the substrate, onto a sensor array, the reflected patterned measurement beam having a periodically varying intensity distribution in a second direction, having the period P, wherein the sensor array comprises a plurality of sensing elements, the plurality of sensing elements being arranged along the second direction at a pitch that is smaller than or substantially equal to half the period P, and wherein the sensor array comprises a first set of sensing elements and a second set of sensing elements that are alternatingly arranged along the second direction at a pitch p, wherein n*p, n being an even number, corresponds to the period P of the reflected patterned measurement beam and the sensing elements of the first set of sensing elements are connected at a first common output of the sensor array and the sensing elements of the second set of sensing elements are connected at a second common output of the sensor array; and
determining the height level of the substrate based on one or more signals from the sensor array.

16. The method according to claim 15, comprising directly receiving the periodically varying intensity distribution of the reflected patterned measurement beam at the sensor array.

17. The method according to claim 15, wherein a position along the periodically varying intensity distribution in the second direction has a one-to-one correspondence with a position along the sensor array in the second direction.

18. The method according to claim 15, comprising providing the patterned measurement beam using a projection grating comprising a plurality of slot-shaped apertures.

19. The method according to claim 18, wherein the sensing elements are elongated in a direction perpendicular to the first direction of the periodically varying intensity distribution.

20. A device manufacturing method comprising:
providing a substrate on a substrate table;
measuring a height level of the substrate on the substrate table using the method of claim 15;
positioning the substrate at least partly based on the measured height level; and
projecting a patterned beam of radiation onto the substrate.

* * * * *